United States Patent
Tsai

(10) Patent No.: US 10,916,555 B2
(45) Date of Patent: Feb. 9, 2021

(54) STRUCTURE OF MEMORY CELL AND METHOD FOR FABRICATING THE SAME

(71) Applicant: United Microelectronics Corp., Hsinchu (TW)

(72) Inventor: Chin-Chin Tsai, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/264,326

(22) Filed: Jan. 31, 2019

(65) Prior Publication Data
US 2020/0251482 A1   Aug. 6, 2020

(51) Int. Cl.
*H01L 27/11568* (2017.01)
*H01L 29/66* (2006.01)
*H01L 29/792* (2006.01)
*H01L 21/28* (2006.01)

(52) U.S. Cl.
CPC .. *H01L 27/11568* (2013.01); *H01L 29/40117* (2019.08); *H01L 29/66833* (2013.01); *H01L 29/792* (2013.01)

(58) Field of Classification Search
CPC ......... H01L 27/11568; H01L 29/40117; H01L 29/66833; H01L 29/792
USPC ........................................................ 257/326
See application file for complete search history.

(56) References Cited

U.S. PATENT DOCUMENTS

| | | | | |
|---|---|---|---|---|
| 6,091,104 A | * | 7/2000 | Chen | G11C 16/0433 257/326 |
| 6,291,297 B1 | * | 9/2001 | Chen | G11C 16/0433 438/265 |
| 6,426,896 B1 | * | 7/2002 | Chen | G11C 16/0416 257/E21.69 |
| 6,844,589 B2 | | 1/2005 | Kim | |
| 6,894,339 B2 | * | 5/2005 | Fan | G11C 16/0433 257/314 |
| 8,901,632 B1 | | 12/2014 | Perera et al. | |
| 9,543,153 B2 | * | 1/2017 | Chuang | H01L 27/11573 |

\* cited by examiner

*Primary Examiner* — Vu A Vu
(74) *Attorney, Agent, or Firm* — J.C. Patents

(57) ABSTRACT

A structure of memory cell includes a memory gate structure, disposed on a substrate, wherein the substrate has an indent region aside the memory gate structure. A selection gate structure is disposed on the substrate at the indent region aside the memory gate structure. A first insulation layer is at least disposed between the memory gate structure and selection gate structure.

19 Claims, 16 Drawing Sheets

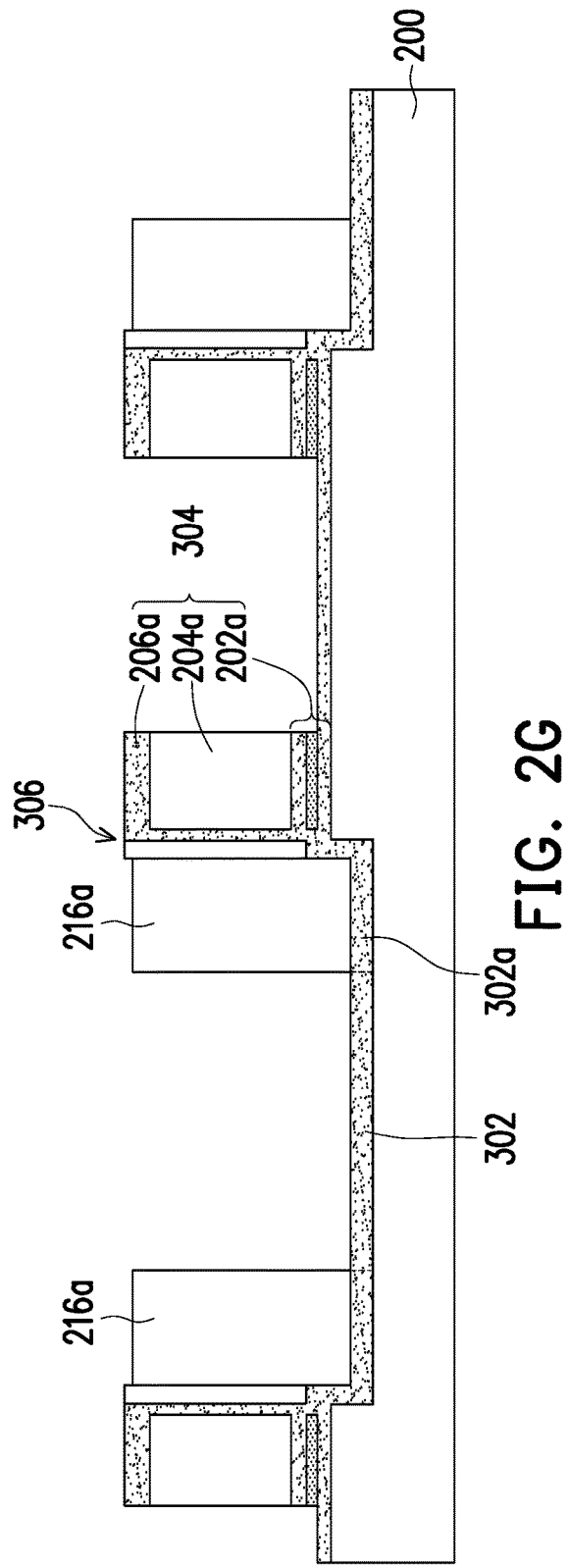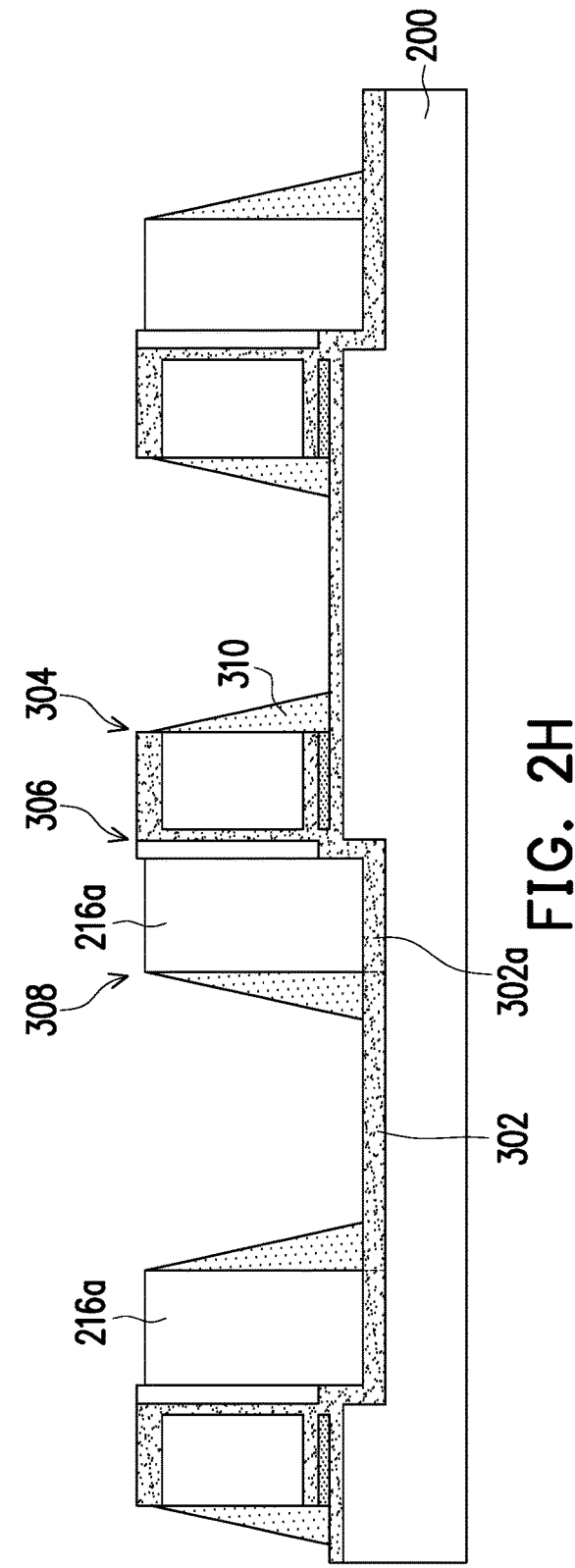

STRUCTURE OF MEMORY CELL AND METHOD FOR FABRICATING THE SAME

BACKGROUND

1. Field of the Invention

The present invention generally relates to semiconductor fabrication technology, and particularly to structure of memory cell and method for fabrication the memory cell.

2. Description of Related Art

The non-volatile semiconductor memory has been very widely used to store data permanently as the digital information produced by various digital electronic apparatus, such as camera, video apparatus, mobile phone, flat computer, computer system, . . . , and so on. The non-volatile semiconductor memory has been a very popular tool to store a large amount of information.

The digital information is produced more and more in daily life due to the great development of digital electronic apparatus, in an example. So, the memory with large storage capability is really intended. In this situation, the cell size of memory is then needed to be reduced, so to increase the storage capability while the actual volume of the memory may also be reduced for easy carrying. In addition, the performance of the memory cell may get worse, while the cell sized is reduced, in which the memory cell may lose the data as store, or even cannot correctly store the data as to be stored.

As the development on designing the non-volatile memory cell, two-transistor (2T) SONOS memory cell has been proposed, in which SONOS represents a stack of silicon-oxide-nitride-oxide-silicon. For the 2T SONOS memory cell, it includes a selection gate structure and a memory gate structure. The gate insulating layer for the selecting gate structure is a usually dielectric layer. A memory stack for the storage gate structure includes a structure of ONO (oxide-nitride-oxide) for keeping charges so to store the bit data.

How to design the 2T SONOS memory cell to improve the performed is still an issue in further development.

SUMMARY OF THE INVENTION

The invention provides a structure of memory cell, in which is a size of selection gate structure may be increased and then is capable of improving the performance of the memory cell by at least reducing a leakage current flowing through the channel under the selection gate.

In an embodiment, the invention provides a structure of memory cell, comprising a memory gate structure disposed on a substrate, wherein the substrate has an indent region aside the memory gate structure. In addition, a selection gate structure is disposed on the substrate at the indent region aside the memory gate structure. A first insulation layer is at least disposed between the memory gate structure and selection gate structure.

In an embodiment, as to the structure of memory cell, it further comprises a spacer on an exposed sidewall of the memory gate structure and an exposed sidewall of the selection gate structure.

In an embodiment, as to the structure of memory cell, the indent region of the substrate conformally adapts the selection gate structure at a bottom portion.

In an embodiment, as to the structure of memory cell, the indent region of the substrate adapts the selection gate structure and a next selection gate structure of a next memory cell, so the two selection gate structures are disposed at two opposite sidewalls of the indent region.

In an embodiment, as to the structure of memory cell, the indent region has a depth in a range of 30 angstroms to 70 angstroms.

In an embodiment, as to the structure of memory cell, the memory gate structure comprises a charge storage layer disposed on the substrate; a memory gate disposed on the charge storage layer; a cap layer disposed on the memory gate; and a dielectric layer at least disposed on a sidewall of the memory gate to at least provide the first insulation layer between the memory gate structure and selection gate structure.

In an embodiment, as to the structure of memory cell, the selection gate structure comprises a second insulating layer on a sidewall and a bottom of the indent region and a selection gate on the second insulating layer.

In an embodiment, as to the structure of memory cell, the second insulating layer is on the indent region of the substrate and conformally adapts the selection gate structure at a bottom portion.

In an embodiment, as to the structure of memory cell, the second insulating layer is on the indent region of the indent region of the substrate and adapts the selection gate structure and a next selection gate structure of a next memory cell.

In an embodiment, as to the structure of memory cell, the charge storage layer comprises a stack structure of oxide, nitride and oxide (ONO).

In an embodiment, as to the structure of memory cell, the dielectric layer also covers on a top of the memory gate.

In an embodiment, as to the structure of memory cell, the memory gate structure and the selection gate structure are substantially same height.

In an embodiment, the invention also provides a method for fabrication memory cell, comprising forming a memory gate structure on a substrate, wherein the substrate has an indent region aside the memory gate structure, wherein the memory gate structure comprises a first insulation layer at least disposed a sidewall of the memory gate structure. In addition, a selection gate structure is formed on the substrate at the indent region and on the first insulation layer of the memory gate structure.

In an embodiment, as to the method for fabrication memory cell, it further comprises forms a spacer on an exposed sidewall of the memory gate structure and an exposed sidewall of the selection gate structure.

In an embodiment, as to the method for fabrication memory cell, the indent region of the substrate is formed to conformally adapt the selection gate structure at a bottom portion.

In an embodiment, as to the method for fabrication memory cell, the indent region of the substrate is formed to adapt the selection gate structure and a next selection gate structure of a next memory cell, so the two selection gate structures are disposed at two opposite sidewalls of the indent region.

In an embodiment, as to the method for fabrication memory cell, the indent region has a depth in a range of 30 angstroms to 70 angstroms.

In an embodiment, as to the method for fabrication memory cell, the step of forming the memory gate structure comprises: forming a charge storage layer on the substrate; forming a memory gate on the charge storage layer; a cap layer disposed on the memory gate; and forming a dielectric layer, at least disposed on a sidewall of the memory gate to at least provide the first insulation layer between the memory gate structure and selection gate structure.

In an embodiment, as to the method for fabrication memory cell, the step of forming the selection gate structure comprises: forming a second insulating layer on a sidewall and a bottom of the indent region; and forming a selection gate on the second insulating layer.

In an embodiment, as to the method for fabrication memory cell, the second insulating layer is on the indent region of the substrate and conformally adapts the selection gate structure at a bottom portion.

In an embodiment, as to the method for fabrication memory cell, the second insulating layer is on the indent region of the indent region of the substrate and adapts the selection gate structure and a next selection gate structure of a next memory cell.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2H are drawings in cross-sectional view, schematically illustrating a method for fabrication a memory cell, according to an embodiment of the invention.

DESCRIPTION OF THE EMBODIMENTS

The invention is directed to the semiconductor technology to fabricate a memory cell with respect to the structure of the memory cell. The memory cell comprises a memory gate structure and a selection gate structure of the 2T SONOS memory cell, in which the sizes of the selection gate structure is effectively enlarged, at least capable of reducing a leaking current at the channel under the selection gate structure. The operation performance of the memory cell may be effectively improved.

Several embodiments are provided for describing the invention but the invention is not just limited to the embodiments as provided. Further, some of the embodiments as provided may be properly combined into another embodiment.

Figure 1:
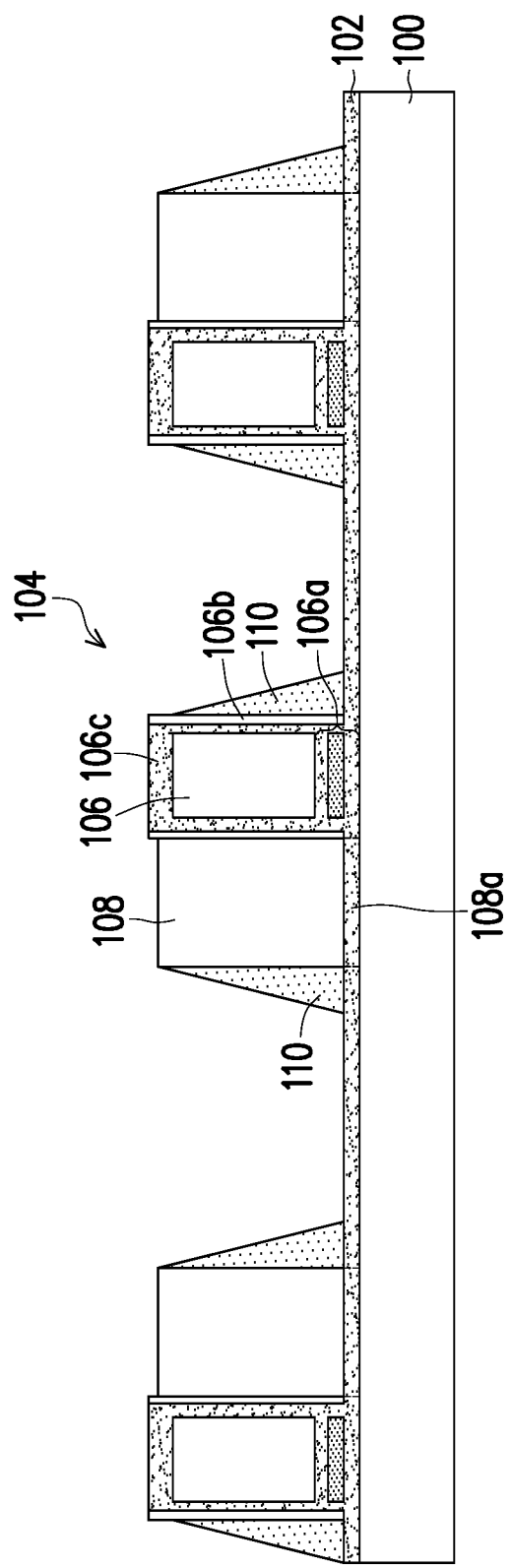
FIG. 1 is a drawing in cross-sectional view, schematically illustrating a structure of 2T memory cell as being looked into, according to an embodiment of the invention.

The invention has looked into a usual 2T SONOS memory cell and found the issue to be at least excluded. FIG. 1 is a drawing in cross-sectional view, schematically illustrating a structure of 2T memory cell as being looked into, according to an embodiment of the invention.

Referring to FIG. 1, a structure of 2T SONOS memory cell is taken in the invention to look into. The gate structure for the 2T memory cell 104 comprises a memory gate 106 and a selection gate 108, disposed over a substrate 100. The memory gate 106 has a spacer 106b on the sidewall. The selection gate 108 is disposed on the spacer 106b aside the memory gate 106, in which the spacer 106b insulates the selection gate 108 and the memory gate therebetween. Further, a charge storage layer 106a is disposed between the memory gate 106 and the substrate 100, capable of storing charges in operation so to store the binary data. The charge storage layer 106a may be a structure of ONO layer. Further, a cap layer 106c may also be on top of the memory gate 106. The memory gate 106 may also be referred as a floating gate. In addition, a gate dielectric layer 108a is between the substrate 100 and the selection gate 108. The selection gate 108 is to be operated as a usual gate of a transistor. In fabrication, a portion of a bottom oxide 102 of the ONO on the substrate 100 is taken to provide the gate dielectric layer 108a. Further, a spacer 110 is formed on the sidewall of the gate structure of the memory cell 104.

As looking to the operation of the memory cell, a leakage current in operation may flow through the channel under the selection gate 108 when the device size is greatly reduced. The operation performance of the memory cell gets poor. To effectively exclude the leaking current under the selection gate, the size of the selection gate may be enlarged. However, if the selection gate is enlarged by increasing the width, the device size at the horizontal direction is increasing as well. The invention has proposed the selection gate structure, which is enlarged by increasing the vertical length without increasing the width. The device size as occupying the available device area is not increased.

FIG. 2A to FIG. 2H are drawings in cross-sectional view, schematically illustrating a method for fabrication a memory cell, according to an embodiment of the invention.

Figure 2A:
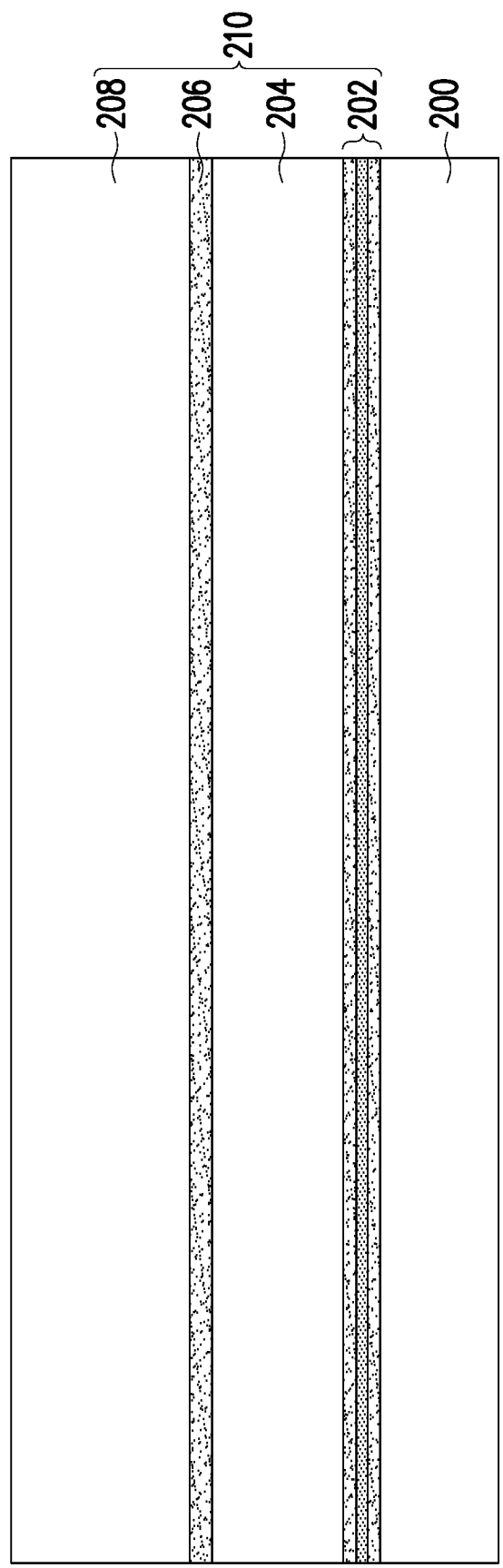

Referring to FIG. 2A, a substrate 200 is provided as a structure base. A charge storage layer 202 is formed on the substrate 200. The charge storage layer 202 is used to store the charges according to the operation voltages on the memory cell. The charge storage layer 202 in an embodiment may be an ONO layer, in which the charges may be kept at the nitride layer thereof.

A memory gate layer 204, such as a polysilicon layer, is disposed on the charge storage layer 202. The memory gate layer 204 is formed at current stage but would be patterned into the actual memory gate latter. A dielectric layer 206 is formed on memory gate layer 204. The dielectric layer 206 in an embodiment may be tetraethoxysilane (TEOS) material. Another polysilicon layer 208 serving as a mask in an embodiment is formed on the dielectric layer 206. The charge storage layer 202, the memory gate layer 204, the dielectric layer 206 and the polysilicon layer 208 together can be referred as a stacked layer 210, disposed on the substrate. The stacked layer 210 would be patterned into a memory fat structure.

Figure 2B:
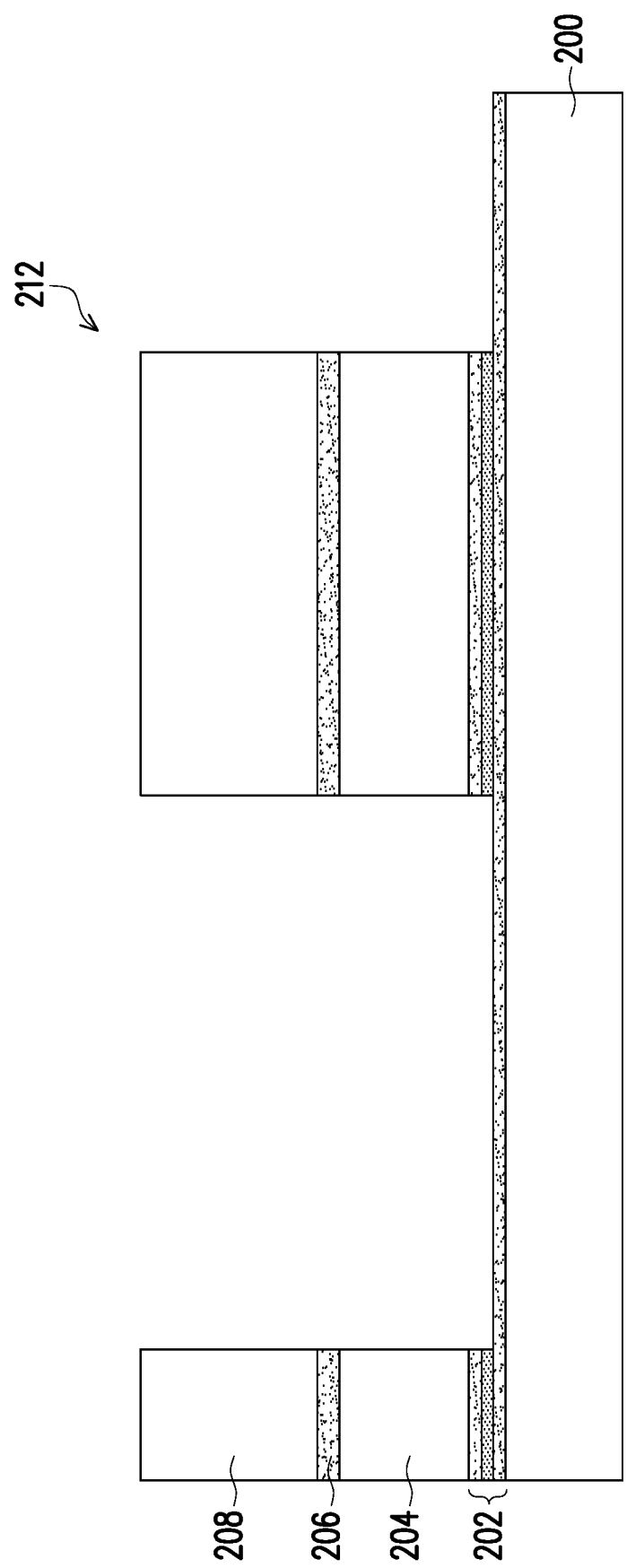

Referring to FIG. 2B, the stacked layer 210 is patterned remove a portion of the stack layer 210. The remaining portion of the stacked layer 210 structurally becomes another stacked layer 212. Here as to the ONO layer for the charge storage 202 in an example, the bottom oxide layer of the ONO layer may be removed to actually expose the substrate 200 or may remains on the substrate 200 without limitation to. In the embodiment, the bottom oxide layer of the ONO layer remains on the substrate 200.

Figure 2C:
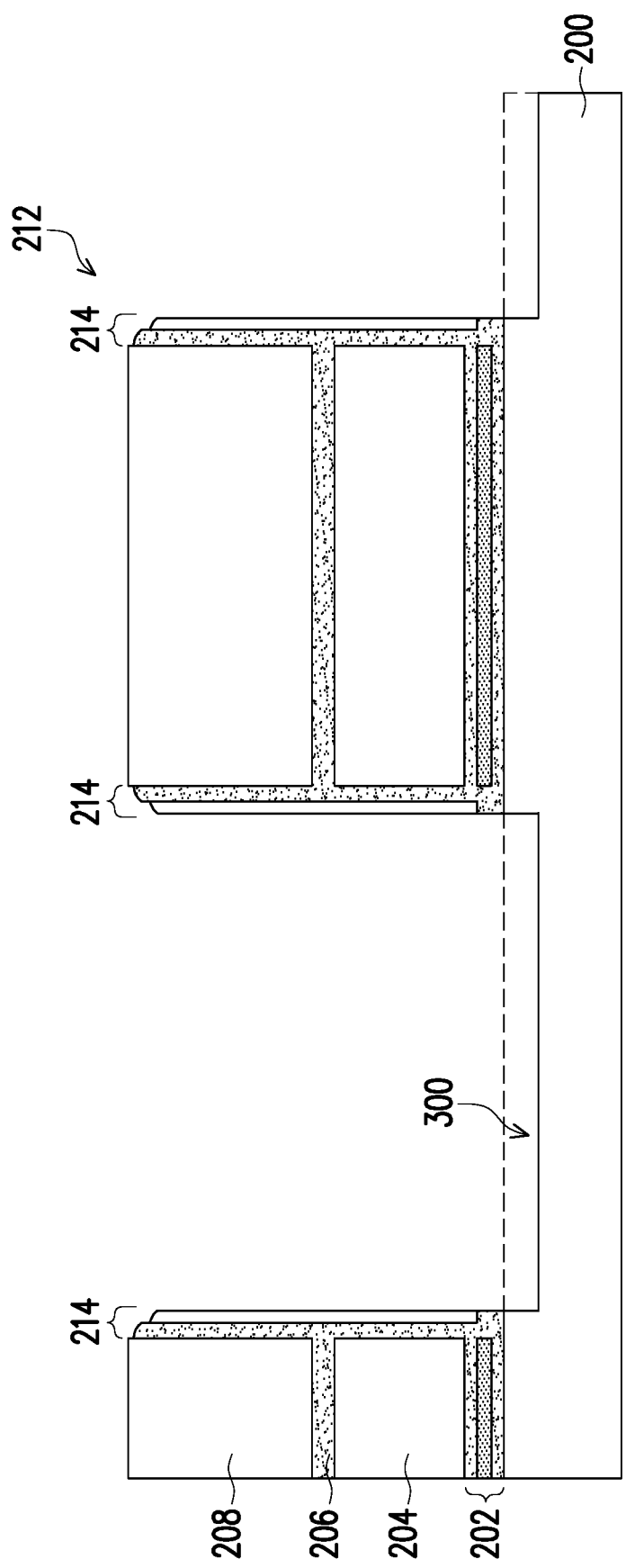

Referring to FIG. 2C, a spacer 214 is formed on sidewalls of the stacked layer 212. The spacer 214 may be a stake of oxide and nitride in an embodiment. The spacer 214 is used to insulate between the memory gate and the selection gate therebetween as to be described. The spacer 214 would merge with the dielectric layer 206 to enclose the memory gate layer 204. The spacer 214 is also used to isolate between the memory gate and the selection gate as to be formed later. After the spacer 214 is formed, in an embodiment, the substrate 200 with the bottom oxide layer of the ONO layer is patterned to have an indent 300 region in the substrate 200.

The indent region 300 has a depth in a range of 30 angstroms to 70 angstroms, in an embodiment. The depth of the indent region 300 is preserved to enlarge the selection gate at the vertical length as to be seen later.

Figure 2D:
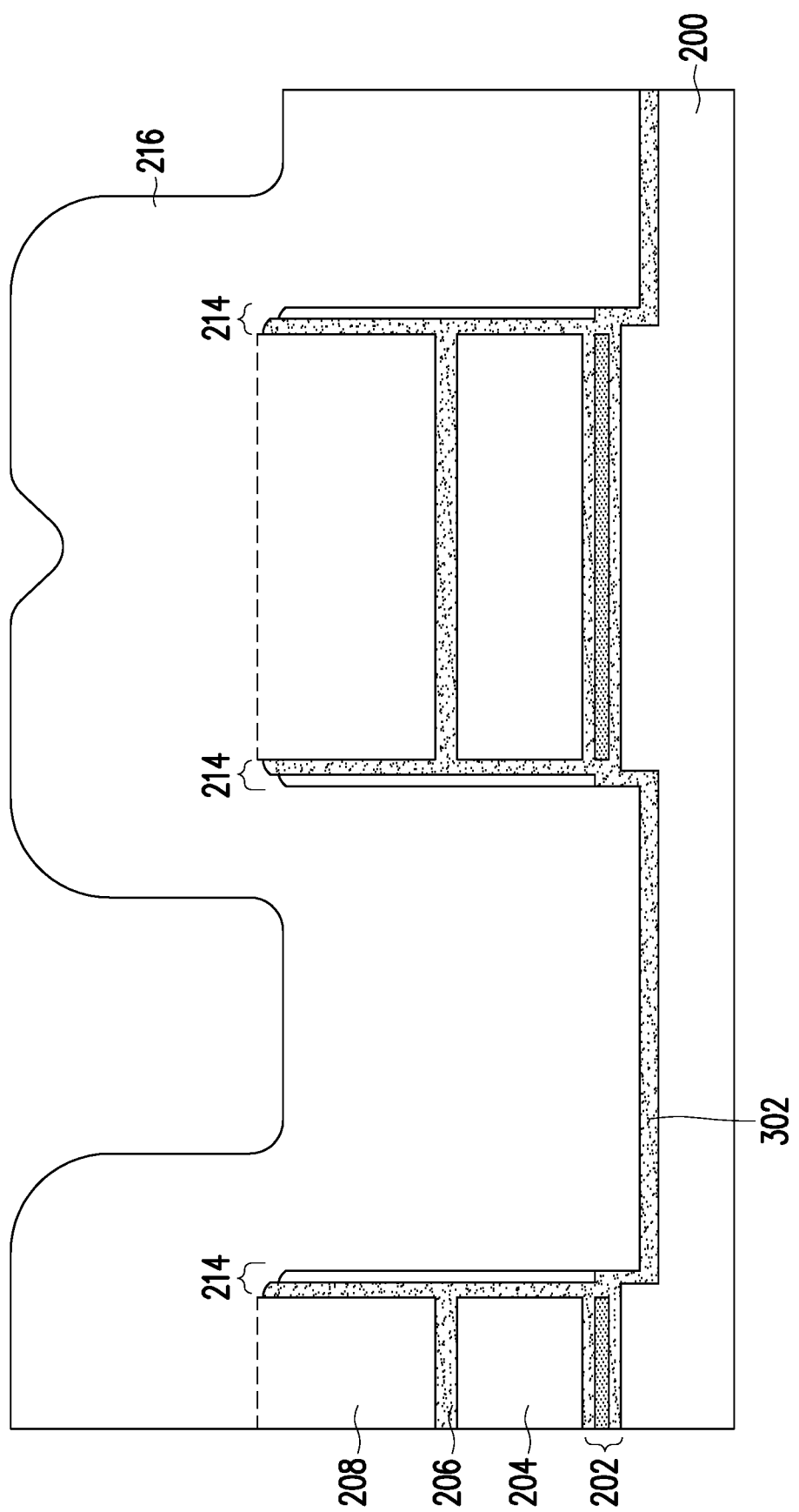

Referring to FIG. 2D, a dielectric layer 302 such as oxide layer is formed on the expose surface of the indent region 300 at least at the sidewall and the bottom of the indent region 300. The dielectric layer 302 is merged with the spacer 214 on the sidewall of the stacked layer 212. Another polysilicon layer 216 is deposited over the substrate 200 to fill the indent region 300 and the indent space between the stacked layer 212. The polysilicon layer 216 is to be processed later into a selection gate. In this stage, the polysilicon layer 216 merges with the polysilicon layer 208.

Figure 2E:
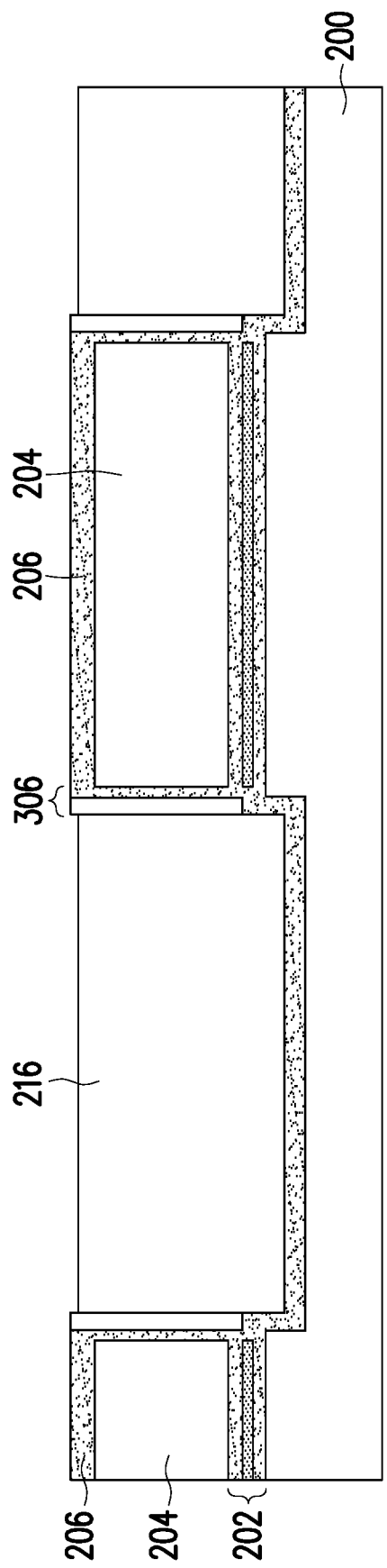

Referring to FIG. 2E, a polishing process such as chemical mechanical polishing (CMP) process is performed to mainly polish the polysilicon layers 216 and 208, and stop at the dielectric layer 206. After the polishing process, the remaining portion of the polysilicon layer 216 is isolated form the memory gate layer 204 by the insulation layer 306. The insulation layer 306 is changed from the spacer 214 after the polishing process. As noted, the polysilicon layer 216 is also referred as a selection gate layer. The memory gate layer 204 and the selection gate layer indicated by 216 at current stage are not the final structures yet and then still need to be patterned.

Figure 2F:
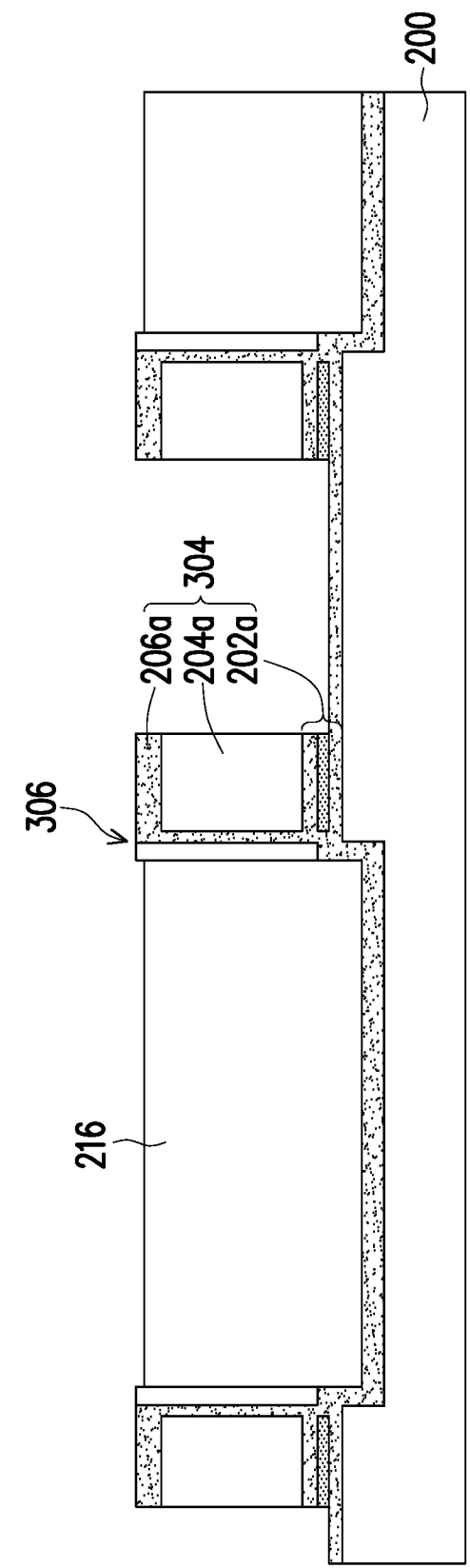

Referring to FIG. 2F, the dielectric later 206 and the memory gate layer 204 are patterned to remove the middle region, so that the remaining portion of the memory gate layer 204 is the actual size to sever as the memory gate located at two sides. The width of the memory gate layer 204 is satisfying a designed range. At this stage, a memory gate structure 304 is basically formed by the remaining portion of the dielectric layer 206, the memory gate layer 204, the charge storage layer 202, which layers now change to the cap layer 206a, the memory gate 204a, the charge storage layer 202a as comprised in a memory gate structure 304. As further noted, the bottom oxide layer of the charge storage layer 202 may still remain to cover the substrate 200 for protection in the patterning process as an embodiment. However, the bottom oxide layer of the charge storage layer 202 may be removed as well but an additional oxide layer may be formed later according to the actual need.

Referring to FIG. 2G, the polysilicon layer 216 is then patterned in to the selection gate 216a with the actual size as needed. The selection gate 216a is next to the memory gate 204a but isolated by the insulating layer 306.

In the invention, the width of the selection gate 216a may remain small as designed without enlarging the device area, which consumes the available device area. However, to at least reduce the leakage current at the channel under the selection gate 216a, the indent region 300 as previously formed (see FIG. 2C) would enlarge the selection gate 216a in vertical direction. In addition, a portion of the insulating layer 306 under the selection gate 216a serve as the gate insulating layer 302a, located on the bottom of the indent region 300 and additionally on a sidewall of the indent region 300, merging with the charge storage layer 202a. As a result, the selection gate 216a is well isolated from the memory gate 204a.

Referring to FIG. 2H, a selection gate structure 308 has been formed comprising the selection gate 216a and the gate insulating layer 302a. However, one sidewall respectively of the selection gate structure 308 and the memory gate structure 304 is still exposed. To have well isolation with protection, a spacer 310 is further formed on the sidewall of the selection gate structure 308 and the memory gate structure 304 opposite to the insulating layer 306.

The gate structure for the 2T memory cell in FIG. 2H is formed. Then, the subsequent fabrication processes are continuously performed based on the gate structure as formed. However, the invention is not limited to the subsequent fabrication processes.

As further noted, the foregoing selection structure with enlarged size may be fabricated another fabrication, in which some fabrication steps are slight modified. FIG. 3A to FIG. 3I are drawings in cross-sectional view, schematically illustrating a method for fabrication a memory cell, according to an embodiment of the invention.

Figure 3A:
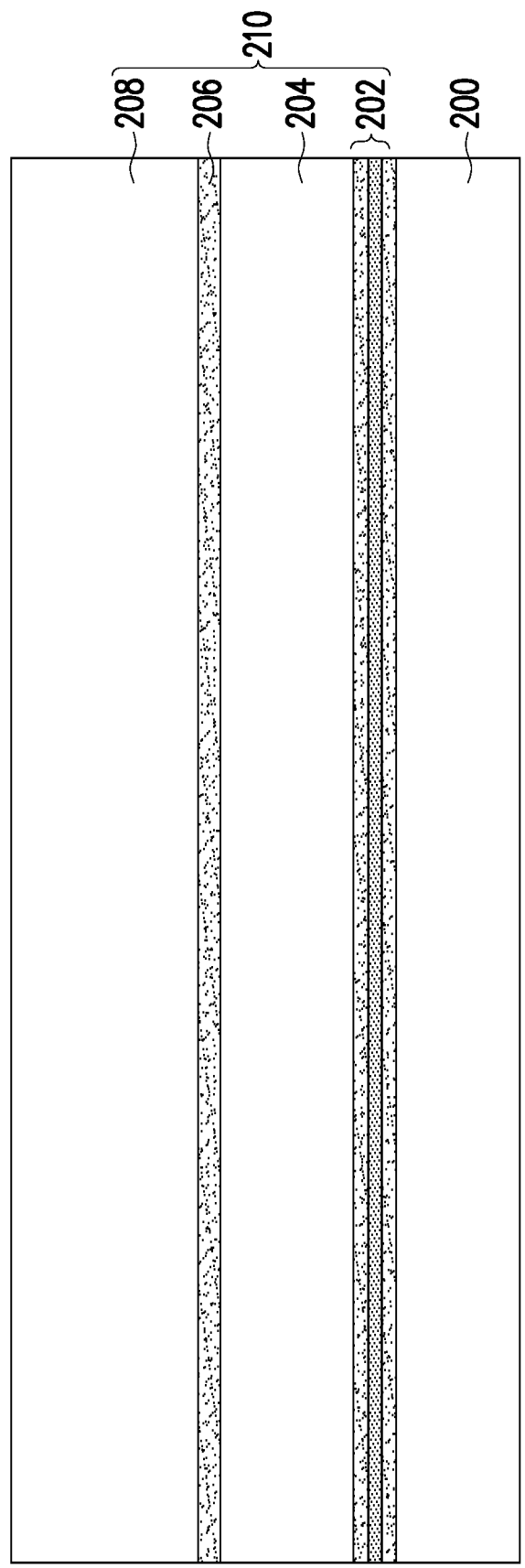
FIG. 3A to FIG. 3I are drawings in cross-sectional view, schematically illustrating a method for fabrication a memory cell, according to an embodiment of the invention.

Referring to FIG. 3A, similar to FIG. 2A in the beginning stage, the stack layer 210 is formed on the substrate 200 without further descriptions.

Figure 3B:
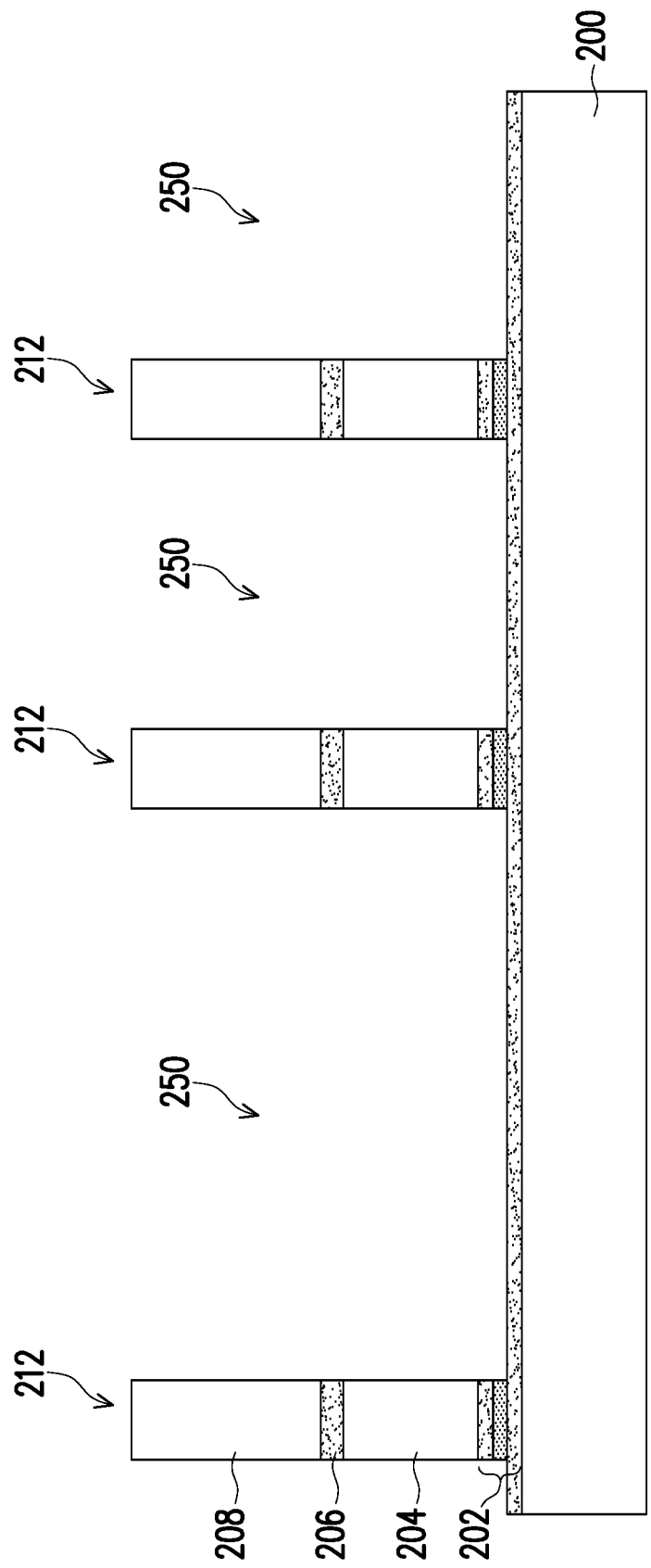

Referring to FIG. 3B, the stack layer 210 is patterned into the stack layer 212. The width of the stack layer 212 at this stage is the width as intended for the memory gate. In other words, each unit of the stack layer 212 is a preliminary structure for the actual memory gate as to be formed later. A space 250 after the patterning process on the stack layer 210 is formed between the stack layer 212. The bottom oxide layer of the charge storage layer 202 may still remain to protect the substrate 200. However, this is not the only limitation in the invention. In an embodiment, the bottom oxide layer of the charge storage layer 202 may be also patterned together to expose the substrate 200.

Figure 3C:
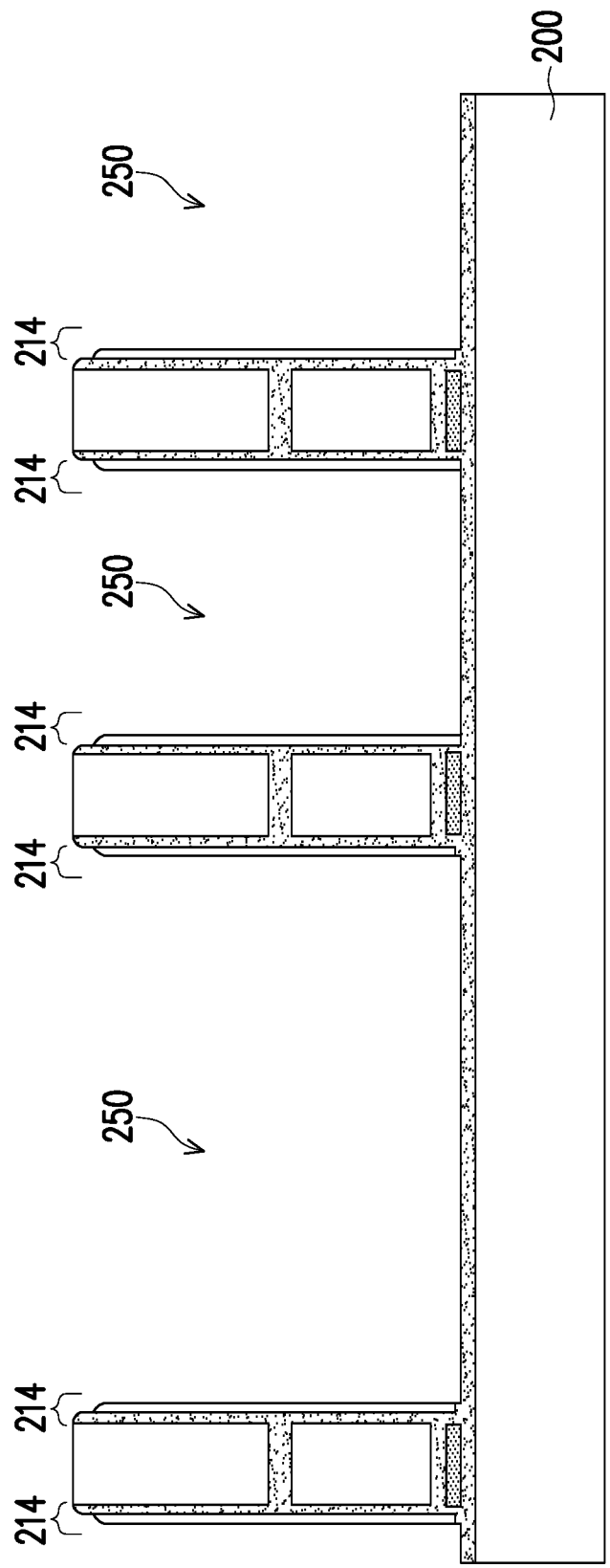

Referring to FIG. 3C, a spacer 214 comprising oxide and nitride in an example is formed on the sidewall of the stack layer 212, in which the nitride spacer is on the oxide spacer in an example. The spacer 214 merges with the remaining bottom oxide of the charge storage layer 302.

Figure 3D:
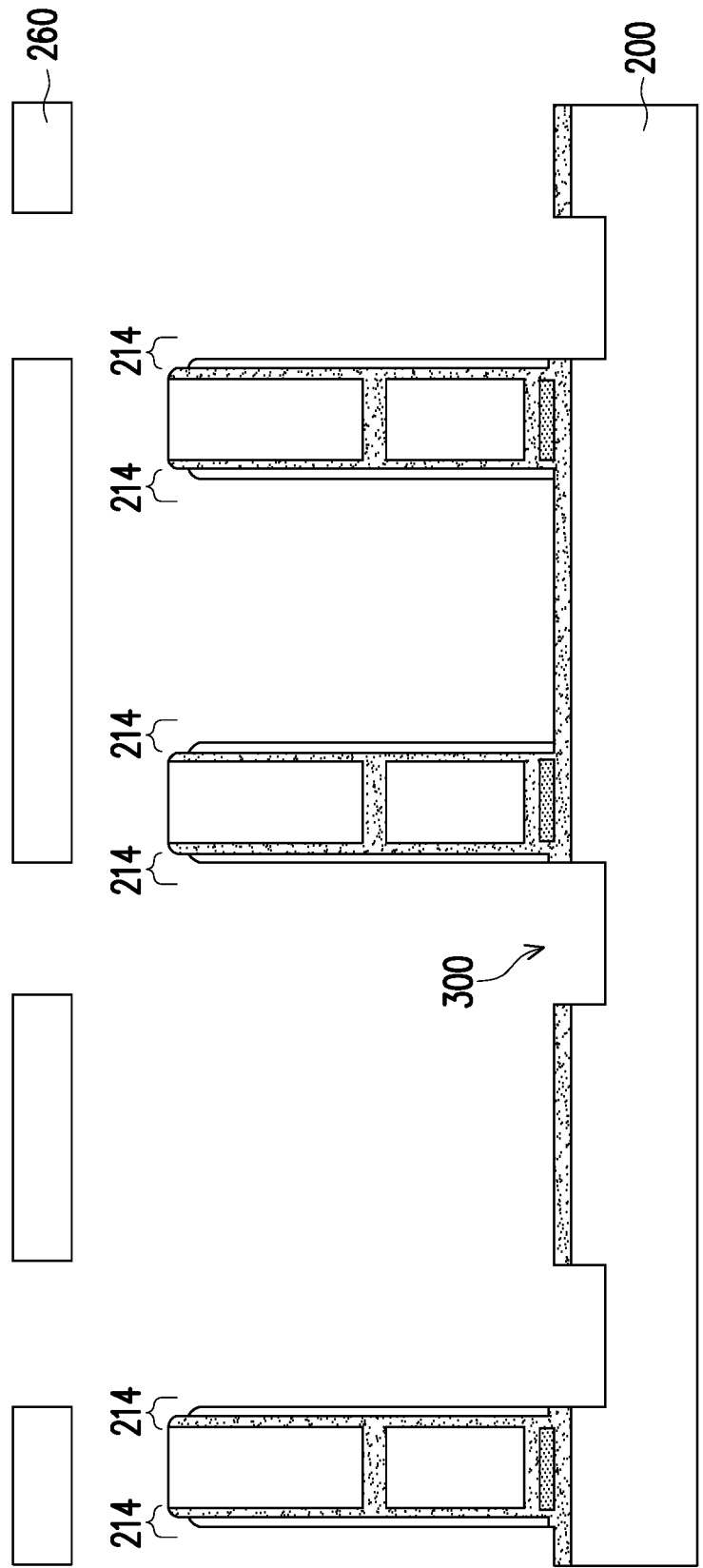

Referring to FIG. 3D, the substrate 200 with the bottom oxide of the ONO layer of the charge storage layer 202 are patterned to have indent region 300. In this embodiment, the width of the indent region 300 is different from the indent region 300 in FIG. 2C, but the depth may be in the same rage of 30 angstroms to 70 angstroms. The width of the indent region 300 is preserved for forming the selection gate later. An etching mask 260 with opening pattern is used in the patterning process to precisely form the indent region 300 which would adapt the selection gate.

Figure 3E:
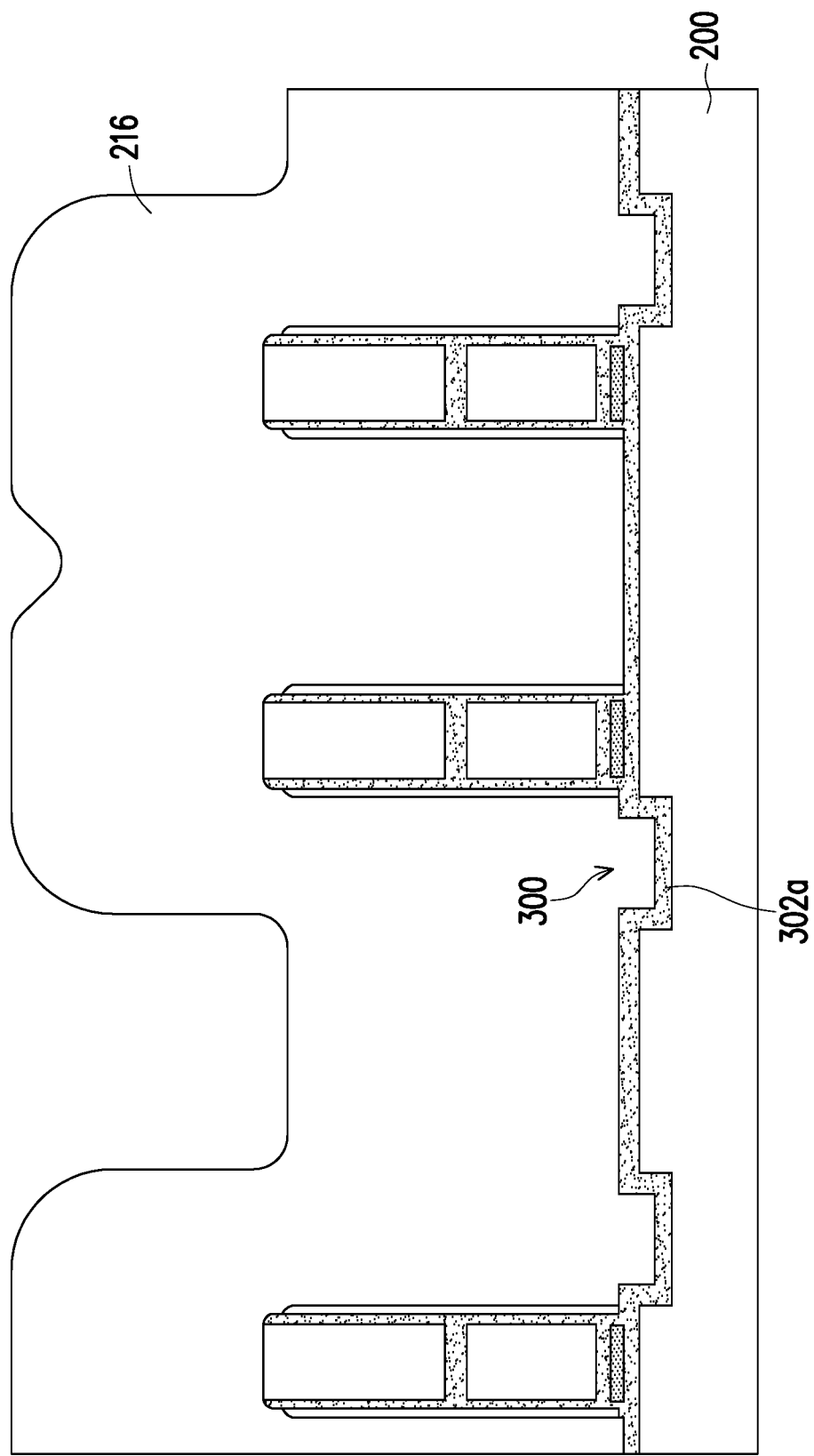

Referring to FIG. 3E, the dielectric layer 302a is formed on the exposed surface comprising a sidewall and the bottom of the indent region 300. As a result, the dielectric layer 302a is merging with the charge storage later 202 under the stack layer 212. Then, another polysilicon layer 216 is formed over the substrate 200 to also fill the space 250 as formed n FIG. 3B. The polysilicon layer 216 is also merging with the polysilicon layer 208.

Figure 3F:
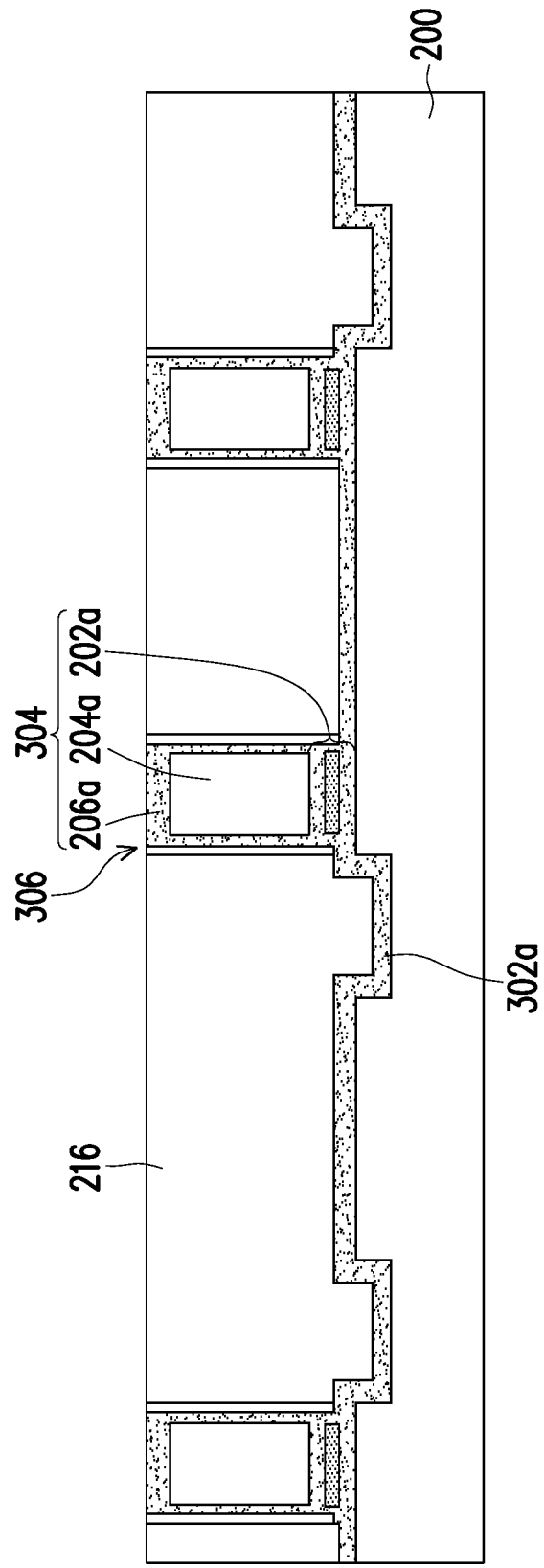

Referring to FIG. 3F, a polishing process is performed to remove the top portion of the stack layer 212 and stop at the dielectric layer 206 seen in FIG. 3B, which becomes the cap layer 206a. At this stage, the memory gate structure 304 is formed, comprising a charge storage layer 202a, the memory gate 204a and the cap layer 206a. The insulating layer 306 comprising dielectric layer oxide and nitride in an embodiment is still formed on the sidewall of the memory gate structure 304. The remaining portion of the polysilicon layer 216 fills the spacer 250 between the memory gate structure 304.

Figure 3G:
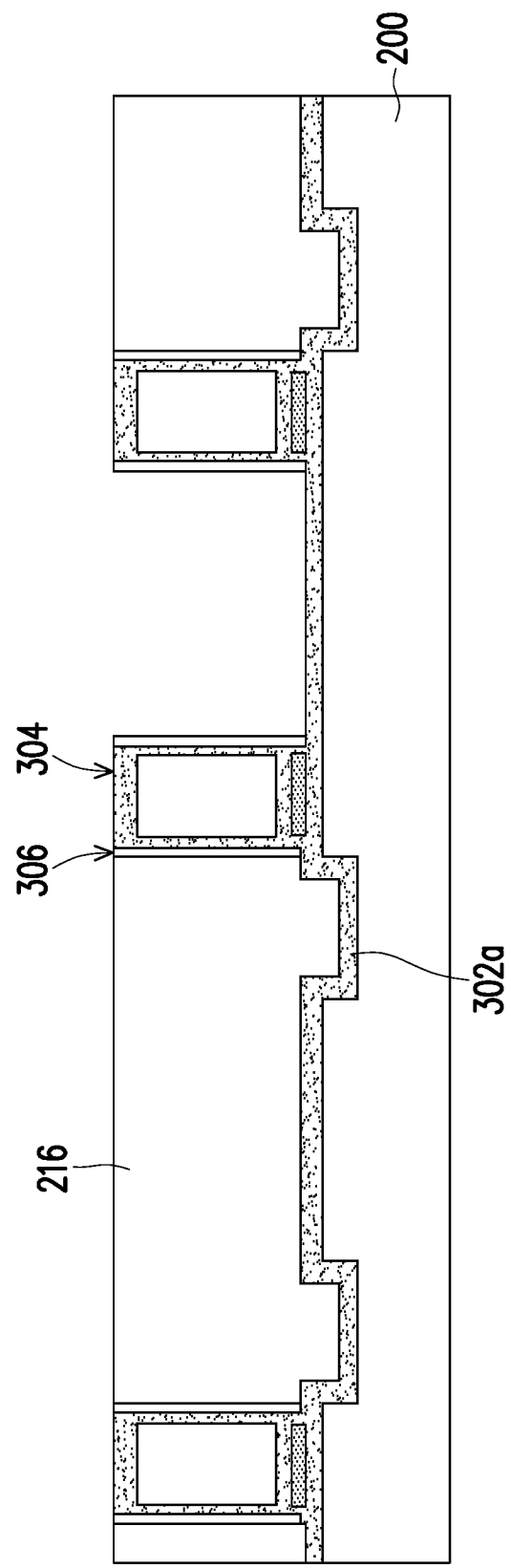

Referring to FIG. 3G, a portion of the polysilicon layer 216 between the memory gate structures 304 without having the indent region 300 is removed, so to expose the memory gate structures 304 at one side. However, the polysilicon layer 216 filling the space 250 having the indent region 300 still remains.

Figure 3H:
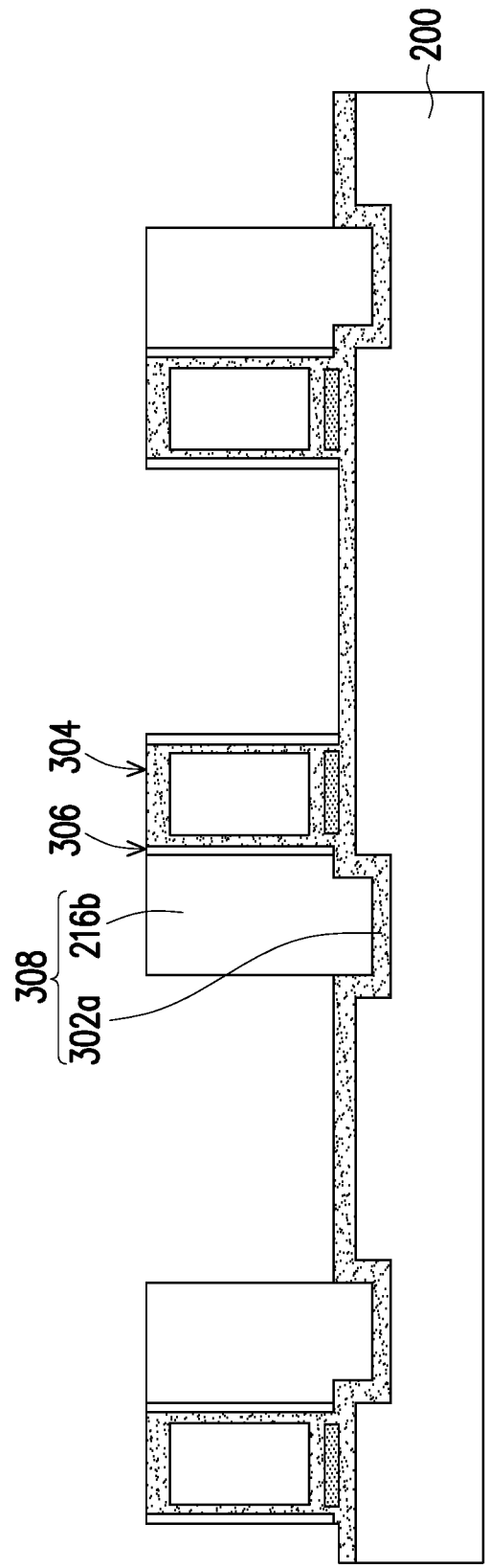

Referring to FIG. 3H, the remaining polysilicon layer 216 connecting to the indent region 300 is patterned to remove the middle region, so the further remaining polysilicon layer 216 with a bottom portion filling in the indent region 300 becomes a selection gate 316 with the intended size. The dielectric layer 302a on the indent region 300 is serving a gate insulation layer with respect to the selection gate 216b. As a result, the selection gate structure comprising the selection gate 216b and the gate insulation layer as indicated by 302a. Similar to the embodiment in FIG. 2H, the size of the selection gate 216b is enlarged at the vertical direction due to the indent region 300.

Figure 3I:
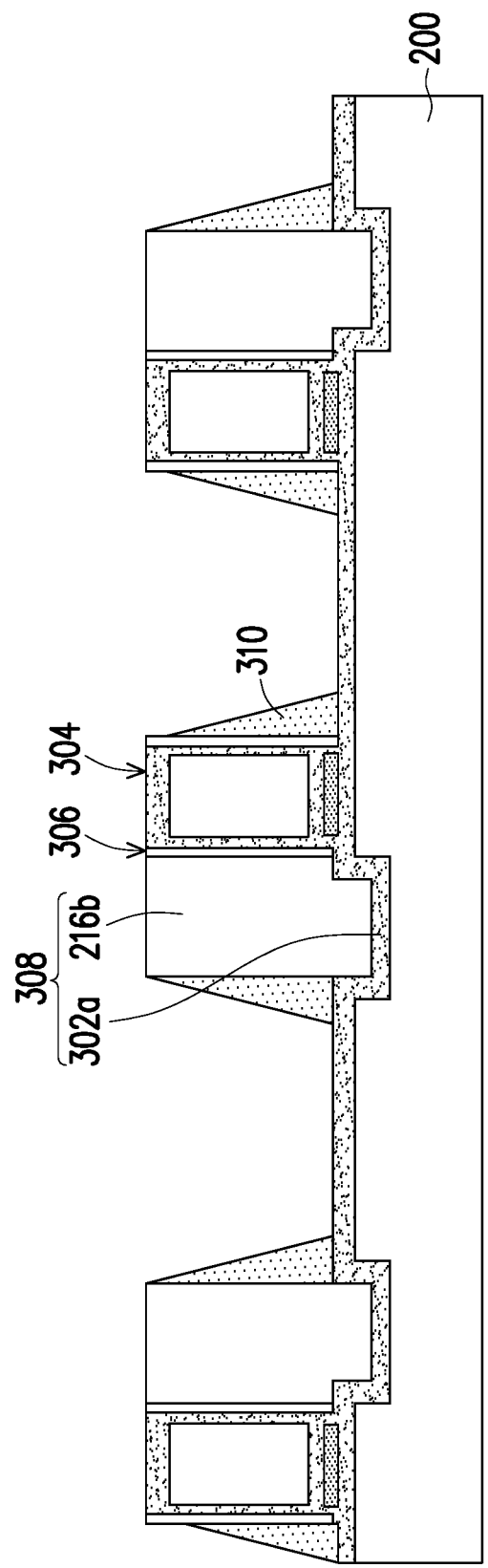

Referring to FIG. 3I, a spacer 310 is formed on the sidewall of the selection gate structure 308 and a sidewall of the memory gate structure 304 for further protection and isolation to the gate structure in 2T memory cell.

The invention has proposed the dual-gate structure of the memory cell comprising the selection gate 216b. The size of the selection gate 216a, 216b is enlarge. The leakage current flowing through the channel under the selection gate can be effectively excluded, so to improve the performance of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of memory cell, comprising:
   a memory gate structure, disposed on a substrate, wherein the substrate has an indent region aside the memory gate structure;
   a selection gate structure, disposed on the substrate at the indent region aside the memory gate structure, wherein the indent region is a local region under the selection gate structure, wherein a channel is generated in the substrate under the selection gate structure, wherein the indent region has a depth in a range of 30 angstroms to 70 angstroms, wherein the selection gate structure comprises a gate insulating layer and a selection gate stacked over the indent and a bottom of the gate layer is lower than a top surface plane of the substrate; and
   a first insulation layer, at least disposed between the memory gate structure and selection gate structure.

2. The structure of memory cell as recited in claim 1, further comprising a spacer on an exposed sidewall of the memory gate structure and an exposed sidewall of the selection gate structure.

3. The structure of memory cell as recited in claim 1, wherein the indent region of the substrate conformally adapts the selection gate structure at a bottom portion.

4. The structure of memory cell as recited in claim 1, wherein the indent region of the substrate adapts the selection gate structure and a next selection gate structure of a next memory cell, so the two selection gate structures are disposed at two opposite sidewalls of the indent region.

5. The structure of memory cell as recited in claim 1, wherein the memory gate structure comprises:
   a charge storage layer, disposed on the substrate;
   a memory gate, disposed on the charge storage layer;
   a cap layer, disposed on the memory gate and a dielectric layer, at least disposed on a sidewall of the memory gate to at least provide the first insulation layer between the memory gate structure and selection gate structure.

6. The structure of memory cell as recited in claim 5, wherein the selection gate structure comprises:
   a second insulating layer on a sidewall and a bottom of the indent region; and
   a selection gate on the second insulating layer.

7. The structure of memory cell as recited in claim 6, wherein the second insulating layer is on the indent region of the substrate and conformally adapts the selection gate structure at a bottom portion.

8. The structure of memory cell as recited in claim 6, wherein the second insulating layer is on the indent region of the indent region of the substrate and adapts the selection gate structure and a next selection gate structure of a next memory cell.

9. The structure of memory cell as recited in claim 5, wherein the charge storage layer comprises a stack structure of oxide, nitride and oxide.

10. The structure of memory cell as recited in claim 5, wherein the dielectric layer also covers on a top of the memory gate.

11. The structure of memory cell as recited in claim 1, wherein the memory gate structure and the selection gate structure are substantially same height.

12. A method for fabrication memory cell, comprising:
    forming a memory gate structure on a substrate, wherein the substrate has an indent region aside the memory gate structure, wherein the memory gate structure comprises a first insulation layer at least disposed a sidewall of the memory gate structure; and
    forming a selection gate structure on the substrate at the indent region and on the first insulation layer of the memory gate structure, wherein the indent region is a local region under the selection gate structure, wherein a channel is generated in the substrate under the selection gate structure, wherein the indent region has a depth in a range of 30 angstroms to 70 angstroms, wherein the selection gate structure comprises a gate insulating layer and a selection gate stacked over the indent and a bottom of the gate layer is lower than a top surface plane of the substrate.

13. The method for fabrication memory cell recited in claim 12, further forming a spacer on an exposed sidewall of the memory gate structure and an exposed sidewall of the selection gate structure.

14. The method for fabrication memory cell recited in claim 12, wherein the indent region of the substrate is formed to conformally adapt the selection gate structure at a bottom portion.

15. The method for fabrication memory cell recited in claim 12, wherein the indent region of the substrate is formed to adapt the selection gate structure and a next selection gate structure of a next memory cell, so the two selection gate structures are disposed at two opposite sidewalls of the indent region.

16. The method for fabrication memory cell recited in claim 12, wherein the step of forming the memory gate structure comprises:
    forming a charge storage layer on the substrate;
    forming a memory gate on the charge storage layer;
    forming a cap layer on the memory gate; and
    forming a dielectric layer, at least disposed on a sidewall of the memory gate to at least provide the first insulation layer between the memory gate structure and selection gate structure.

17. The method for fabrication memory cell recited in claim 16, wherein the step of forming the selection gate structure comprises:
- forming a second insulating layer on a sidewall and a bottom of the indent region; and
- forming a selection gate on the second insulating layer.

18. The method for fabrication memory cell recited in claim 17, wherein the second insulating layer is on the indent region of the substrate and conformally adapts the selection gate structure at a bottom portion.

19. The method for fabrication memory cell recited in claim 17, wherein the second insulating layer is on the indent region of the indent region of the substrate and adapts the selection gate structure and a next selection gate structure of a next memory cell.

* * * * *